(12) United States Patent
Morgan et al.

(10) Patent No.: US 6,205,085 B1
(45) Date of Patent: *Mar. 20, 2001

(54) METHOD AND CIRCUIT FOR SENDING A SIGNAL IN A SEMICONDUCTOR DEVICE DURING A SETUP TIME

(75) Inventors: Donald M. Morgan; Todd A. Merritt, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/490,803

(22) Filed: Jan. 26, 2000

Related U.S. Application Data

(63) Continuation of application No. 09/092,559, filed on Jun. 5, 1998, now Pat. No. 6,055,208.

(51) Int. Cl.[7] ..................................................... G11C 8/00
(52) U.S. Cl. ......................... 365/233; 365/191; 365/230.03
(58) Field of Search ................................ 365/233, 191, 365/194, 230.03, 189.01, 230.01, 51

(56) References Cited

U.S. PATENT DOCUMENTS

| 5,581,512 | 12/1996 | Kitamura | 365/233 |
| 5,623,453 | 4/1997 | Shinozaki | 365/233 |
| 5,703,828 | 12/1997 | Park et al. | 365/230.03 |
| 5,867,447 | 2/1999 | Kosikawa | 365/233 |
| 6,055,208 | * 4/2000 | Morgan et al. | 365/233 |

* cited by examiner

Primary Examiner—David Nelms
Assistant Examiner—Hoai V. Ho
(74) Attorney, Agent, or Firm—Schwegman, Lundberg, Woessner & Kluth, P.A.

(57) ABSTRACT

A memory having a control circuit for initiating a read or a write operation in response to a combination of input signals during a setup time is described. The setup time is a specified time period during which all inputs must remain valid before a next appearance of a rising edge of a clock signal. The control circuit uses the setup time to send a signal from one part of the memory to another part of the memory to avoid the propagation delay time. Further, a circuit is provided which prepares the memory for a write operation prior to the setup time.

20 Claims, 7 Drawing Sheets

METHOD AND CIRCUIT FOR SENDING A SIGNAL IN A SEMICONDUCTOR DEVICE DURING A SETUP TIME

This application is a continuation of U.S. Ser. No. 09/092,559 filed Jun. 5, 1998, now U.S. Pat. No. 6,055,208.

FIELD OF THE INVENTION

The present invention relates to semiconductor memory devices, and more particularly to setup time in a synchronous memory device.

BACKGROUND OF THE INVENTION

Commands to a synchronous dynamic random access memory (SDRAM) are presented in the form of opcodes made up of combinations of low and high levels on the inputs at the time that the clock transitions (fires). These opcodes are scheduled to be valid for a specified minimum time (referred to as setup time) before the system clock fires to validate the command. A specified minimum hold time is also required. The combination of inputs may transition through a different command outside of setup and hold times without detriment since the commands are not normally acted upon until they are validated by a clock edge.

Every integrated circuit has a physical dimension which may require routing a signal from one end of a die to another end of the die. In a typical integrated circuit, some signals are routed across some parts of the circuit to prepare for a certain operation such as a read or write (read/write) operation.

A read/write operation of a typical SDRAM is carried out when a combination of input signals meet a predetermined condition when the system clock transitions high. One part of the integrated circuit in one end of the die analyzes the input signals and determines if their combination is valid for a read/write operation. Once there is valid combination, an enable signal will be issued from this part of the circuit. The enable signal then propagates to another part of the circuit, which could be located in another end of the die, to initiate the read/write operation. It is apparent that time is spent to wait for a signal to propagate from one end of the die to another. This is the propagation delay time that the circuit waits before it starts the read/write operation.

In order to improve the operation of a synchronous memory device, more particularly a read or a write operation, there is a need for a circuit and method which can use the setup time as a time to route a signal through a die so that the propagation delay is avoided or reduced.

SUMMARY OF THE INVENTION

The above-mentioned problem regarding propagation delay time during a setup time, especially during a read or a write operation of a synchronous memory will be addressed by the present invention and which will be understood by reading and studying the following specification. A setup time write and a setup time read/write circuit are described which allow a synchronous memory to fulfill the propagation delay time during a setup time of a read/write operation.

In particular, the present invention describes a memory device comprising a plurality of input signals, a clock signal having a setup time, a plurality of memory cells, and a circuit connected to the input signals and to the clock signal. The circuit is operable for preparing the memory device for an operation on the plurality of memory cells during setup time which is prior to the clock transition.

In another embodiment a synchronous memory device is described. The memory comprises input signals, a setup time write circuit connected to the input signals for producing an output signal to initiate a write operation prior to receiving a write enable signal during a setup time and a read/write setup time circuit connected to the input signals for producing a signal indicating a read or a write operation is being anticipated during a setup time. All operations performed prior to validation by a clock signal (CLK) are fully reversible since it is unknown if an opcode is to be acted upon or is just part of a transition to another state.

In yet another embodiment, a synchronous memory is described which comprises input signals and common input signals. A setup time write circuit connected to the input signals and the common input signals comprises an input circuit for producing an enable signal in response to the input signals, and an output circuit for producing an output signal in response to the common input signals during a setup time.

In yet another embodiment, a method of routing a signal through an integrated circuit is described. The method comprises the steps of receiving a clock signal, receiving input signals, defining a setup time period, producing an output signal in response to the input signals during the setup time, propagating the output signal during the setup time, producing an enable signal in response to the clock signal and the input signals during the setup time and latching the output signal after the setup time.

In yet another embodiment, a method of accessing a synchronous memory device is described. The method comprises the steps of receiving a clock signal, receiving input signals, defining a setup time period, producing an output signal in response to the input signals during the setup time, initiating a memory access during the setup time, generating an enable signal for a memory access during the setup time, receiving the enable signal for a memory access after the setup time and continuing the memory access after the setup time if the enable signal is valid for a memory access.

In yet another embodiment, a method of sending a signal through a die of a semiconductor memory device having memory cells and data write lines located in the proximity of the memory cells is described. The method comprises the steps of receiving a clock signal, determining a setup time, receiving data during the setup time, propagating the data to the data write lines during the setup time, and propagating data into the memory cells after the setup time.

DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is therefore, not to be taken in limiting sense, and the scope of the invention is defined by the appended claims.

Figure 1:
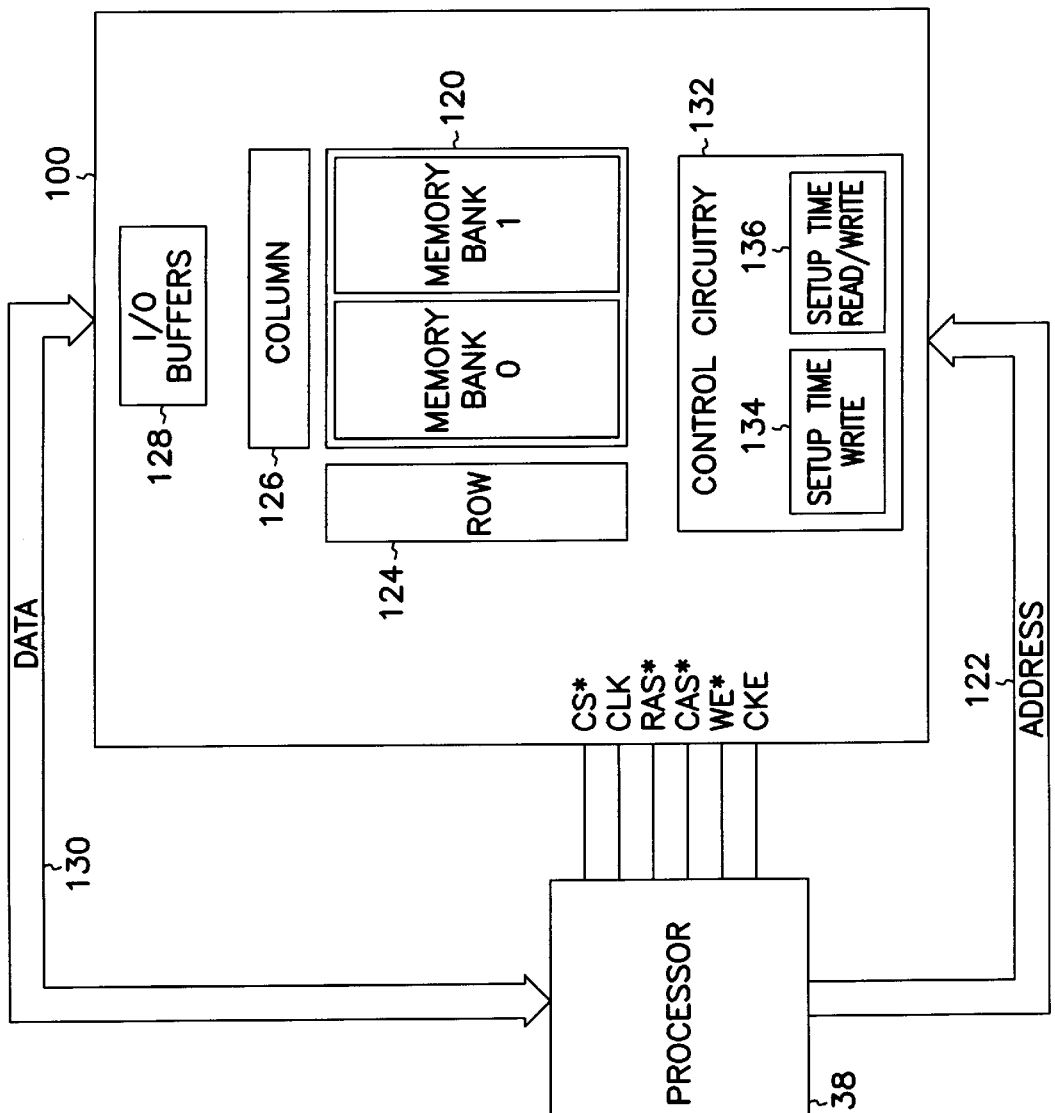
FIG. 1 is a block diagram of one embodiment of a memory device incorporating the present invention.

FIG. 1 illustrates a memory device 100 of the present invention. Memory device 100 can be any type of memory, but is preferably a Synchronous Dynamic Random Access Memory ("SDRAM"). The SDRAM has an array of dynamic memory cells 120 arranged in at least one addressable memory bank. In the exemplary embodiment, memory cells 120 are organized in multiple memory banks comprising a memory bank 0 and a memory bank 1. The memory cells are accessed in response to address signals provided on address lines 122 using row 124 and column 126 decode circuitry. Input/output (I/O) buffers 128 are provided for bi-directional data communication via data communication lines 130. Control circuitry 132 regulates the SDRAM operations in response to control signals which include, but are not limited to, a Chip Select (CS*), a Clock (CLK), Row Access Strobe (RAS*), Column Access Strobe (CAS*), Write Enable (WE*), and Clock Enable (CKE). Control circuitry 132 further comprises a setup time write circuit 134 and a setup time read/write circuit 136 for use during a read/write operation of the SDRAM to increase the speed of operation of the SDRAM. An external processor 138 is provided for both bidirectional data communication and control with the memory. The memory of FIG. 1 has been simplified for illustrating the features of the present invention and is not intended to describe all of the elements and features of an SDRAM. For a more detailed description of the operation of a SDRAM see Micron Technology, Inc. 1997 Synchronous DRAM data book, February 1997, pages 1–44 for a description of a 4 MEG×4/2 MEG×8 SDRAM.

Figure 2:
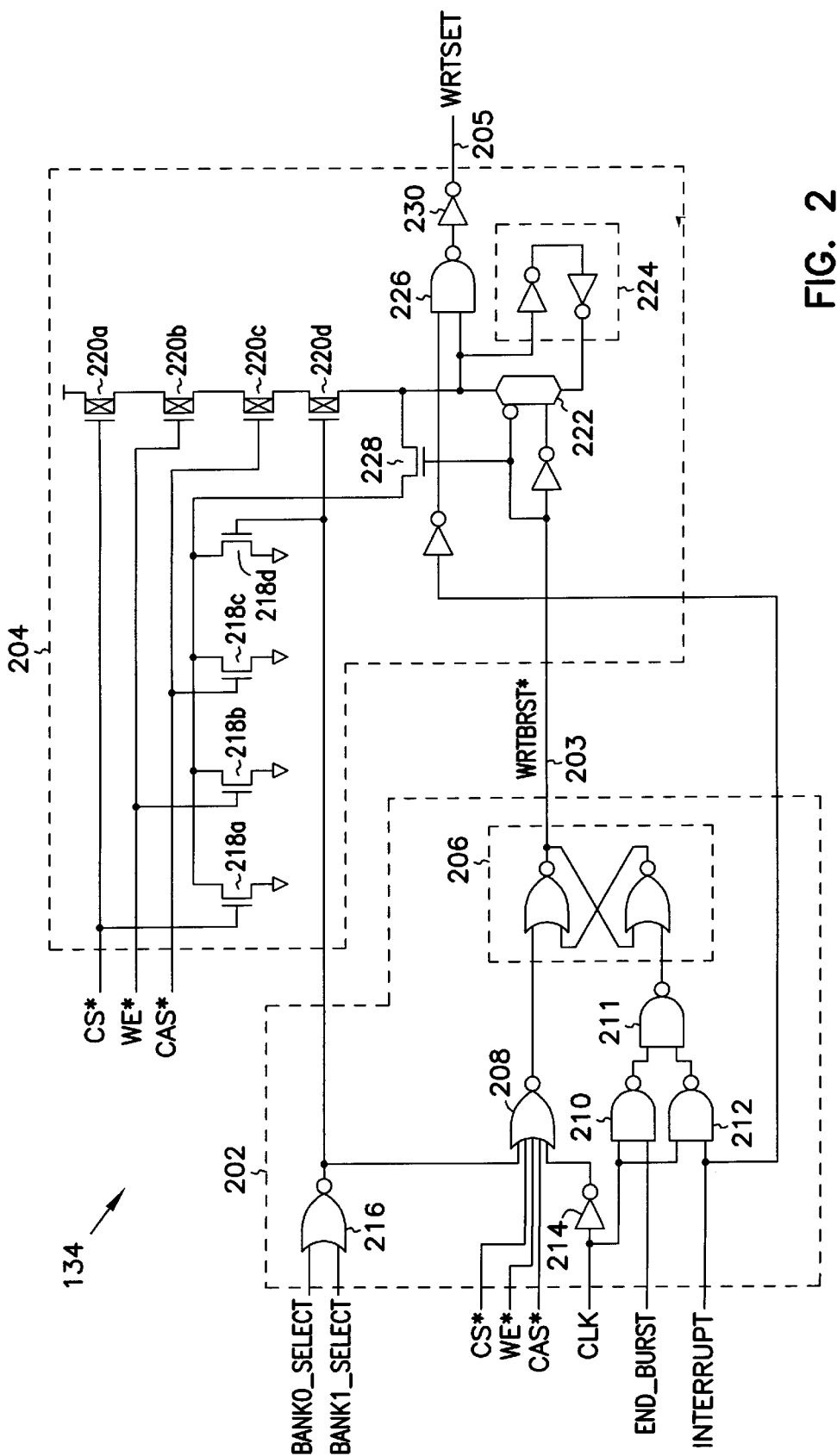
FIG. 2 is a diagram of a setup time write circuit of the memory device of FIG. 1.

FIG. 2 is a schematic diagram of a setup time write circuit which is used during a write operation. As illustrated in FIG. 2, setup time write circuit 134 is designed for an SDRAM having multiple memory banks which share common input and output paths. Each of the memory banks can be selected by asserting its BANK_SELECT signal. This is done by the control circuitry. A read command opcode to either bank will cause the INTERRUPT signal to go high at setup time and stay high if CLK validates the interrupt by transitioning high. An advantage of setup time write circuit 134 in this invention is faster operation of the memory due to decreased delay in initializing internal circuitry.

Setup time write circuit 134 comprises an input circuit 202 having an output 203 for providing an internal enable signal labeled WRTBRST* in response to a plurality of input signals CS*, WE*, CAS*, CL,K, END_BURST, INTERRUPT and the BANK_SELECT signals (BANK0_SELECT or BANK1_SELECT). Input circuit 202 is connected to an output circuit 204 having an output 205 for providing a signal labeled WRTSET. Internal preparation of the memory device for a write operation occurs when WRTSET is in a high state. For WRTSET to be latched in a high state, WRTBRST* must be active (in a low state). WRTBRST* is in a low state when a combination of the input signals is valid for a write operation. A valid combination occurs when either BANK_SELECT and CLK are in a high state and CS*, WE*, CAS*, END_BURST and INTERRUPT are in a low state.

Referring to FIG. 2, input circuit 202 and output circuit 204 receive a plurality of common input signals CS*, WE* and CAS*. During a setup time, if a combination of the inputs of circuit 202 is valid for a write operation, output circuit 204 sets WRTSET to a high state prior to receiving an enable signal WRTBRST* from input circuit 202. This is possible because output circuit 204 receives the same input signals CS*, WE* and CAS* as that of input circuit 202. Consequently, during the setup time, memory 100 can get a head start with the write operation by performing some basic tasks such as propagating data to input of write drivers. During setup time permanent tasks such as writing to memory cells will not be initiated. After the setup time, if the combination is valid for a write operation and if there is no interruption, at the next appearance of the positive edge of CLK, enable signal WRTBRST* will latch WRTSET high. At this point, memory 100 is already a few steps ahead and it will continue with the process of writing to the memory.

Referring to FIG. 2, input circuit 202 comprises a latch 206 connected to output 203 producing the WRTBRST* signal. Latch 206 receives inputs from the outputs of NOR gate 208 and NAND gate 211. NAND gate 211 receives inputs from NAND gate 210 and NAND gate 212. NAND gates 210 and 212 both receive input from an external conventional clock signal CLK, which is also an input to NOR gate 208 through an inverter 214. NAND gates 210 and 212 also receive inputs END_BURST and INTERRUPT respectively. A bank select circuit comprising NOR gate 216 having inputs BANK0_SELECT and BANK1_SELECT and output which provides inputs to both circuits 202 and 204 to indicate that a bank was selected for a write operation.

Output circuit 204 comprises a stack of p-channel transistors 220a–d, and a plurality of n-channel transistors 218a–d. The gates of transistors 218a–c and 220a–c are connected to inputs CS*, WE*, CAS*, respectively, and the gates of transistors 218d and 220d are connected to the output of NOR gate 216 (BANK_SELECT). A multiplexer 222 controlled by signal WRTBRST* and its complement, is connected to two invertors 224 to form a latch, which is connected to one input of NAND gate 226. The other input to NAND gate 226 is an inverted INTERRUPT signal. An n-channel transistor 228 is connected between the common drains of n-channel transistors 218a–d and an input of NAND gate 226. NAND gate 226 is connected to an inverter 230 which is coupled to output 205 which provides signal WRTSET.

Figure 3:
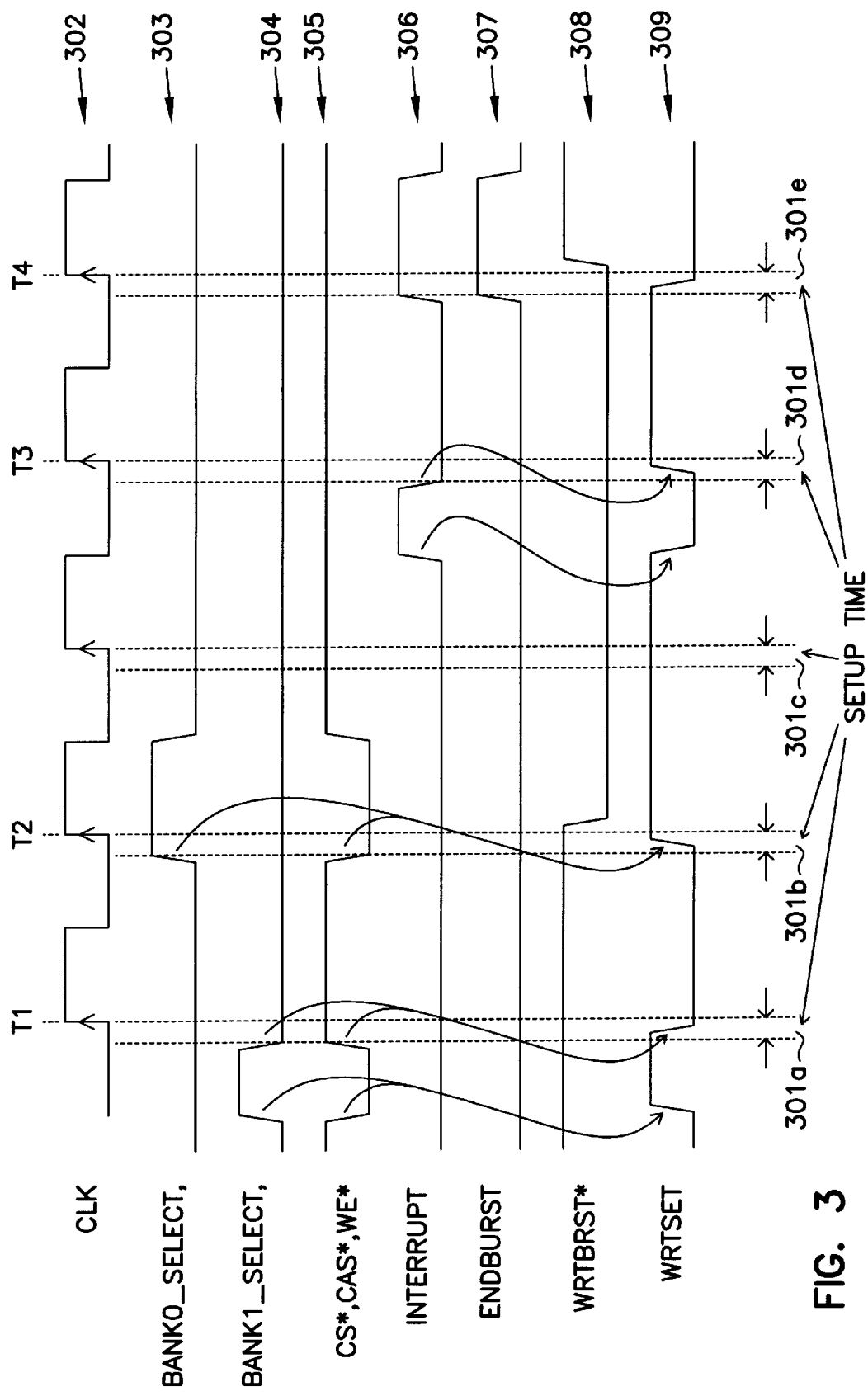
FIG. 3 is a timing diagram of the setup time write circuit of FIG. 2 during a write operation.

Referring to FIGS. 2 and 3, the operation of the present invention is described. A valid combination of inputs signals occur for a write operation during a setup time 301. Setup time 301 is indicated in FIG. 3 as a period of time in which CLK is at a low state prior to the occurrence of a rising edge of CLK on time line 302.

For example, prior to the rising edge of CLK at the time marked TI, and prior to setup time 301a, BANKI_SELECT becomes valid high while CS*, CAS*, and WE* are all low (active). This is the opcode to begin a write operation and WRTSET goes high in anticipation of CLK high and the memory device begins preparation for a write operation. However, as long as this opcode is not valid during the specified setup time 301a before CLK high at T1, no unreversable action is taken as seen at time T1. As can be seen at time T1, the write operation was aborted.

In a second example, during setup time 301b prior to CLK rising edge at time T2, BANK0_SELECT is high, CS*, WE*, CAS*, are low but the CLK is low. This combination of signals causes output circuit 204 to produce a high (active) WRTSET signal and begin preparing the memory device for a write operation. In input circuit 202, the WRTBRST* signal remains high (inactive) due to the clock signal CLK remaining low during the setup time 301b. Since CLK is low (inactive), signal WRTBRST* 203 of latch 206 is at a high state (inactive).

In FIG. 2, output circuit 204, during the setup time, input signals CS*, WE*, CAS* combine with the output of NOR gate 216 to activate p-channel transistors 220a–d, which form a logical AND structure. Since INTERRUPT is low, this causes the output of NAND gate 226 to go low and thus WRTSET is set to a high state and some tasks such as propagating data into the inputs of write drivers can be started. Also notice that when WRTSET is high during setup time, it is not latched because multiplexer 222 is inactive (since WRTBRST* is still high).

Internal signal WRTBRST* 203 (also see line 308 of FIG. 3) will be forced to a low state on the next rising edge of CLK, at time T2 thereby latching the WRTSET signal 205 (also see line 309 of FIG. 3). When WRTBRST* transitions to a low state on the next rising edge of the CLK at time T2, multiplexer 222 is activated and output latch 224 will latch WRTSET high until the end of a write burst cycle. In this second example, the circuitry of FIG. 2 has allowed many internal operations to be performed in preparing for a write operation before the actual clock rising edge. Thus the internal operation of the memory device does not have to wait for an active edge of the clock signal to generate an internal WRTSET signal to enable write operation and so the propagation delay of the WRTSET signal is compensated for.

In case of an interruption, activated by INTERRUPT as seen before the rising edge of CLK at times T3 and T4, WRTSET will be forced to a low state in case the write operation is halted or aborted. If the INTERRUPT signal returns low within the specified setup time before the CLK at time T3 then WRTSET returns high during the setup time 301d and the write operation continues. If INTERRUPT remains high until CLK goes high then the write operation is aborted as shown at time T4.

Figure 4:
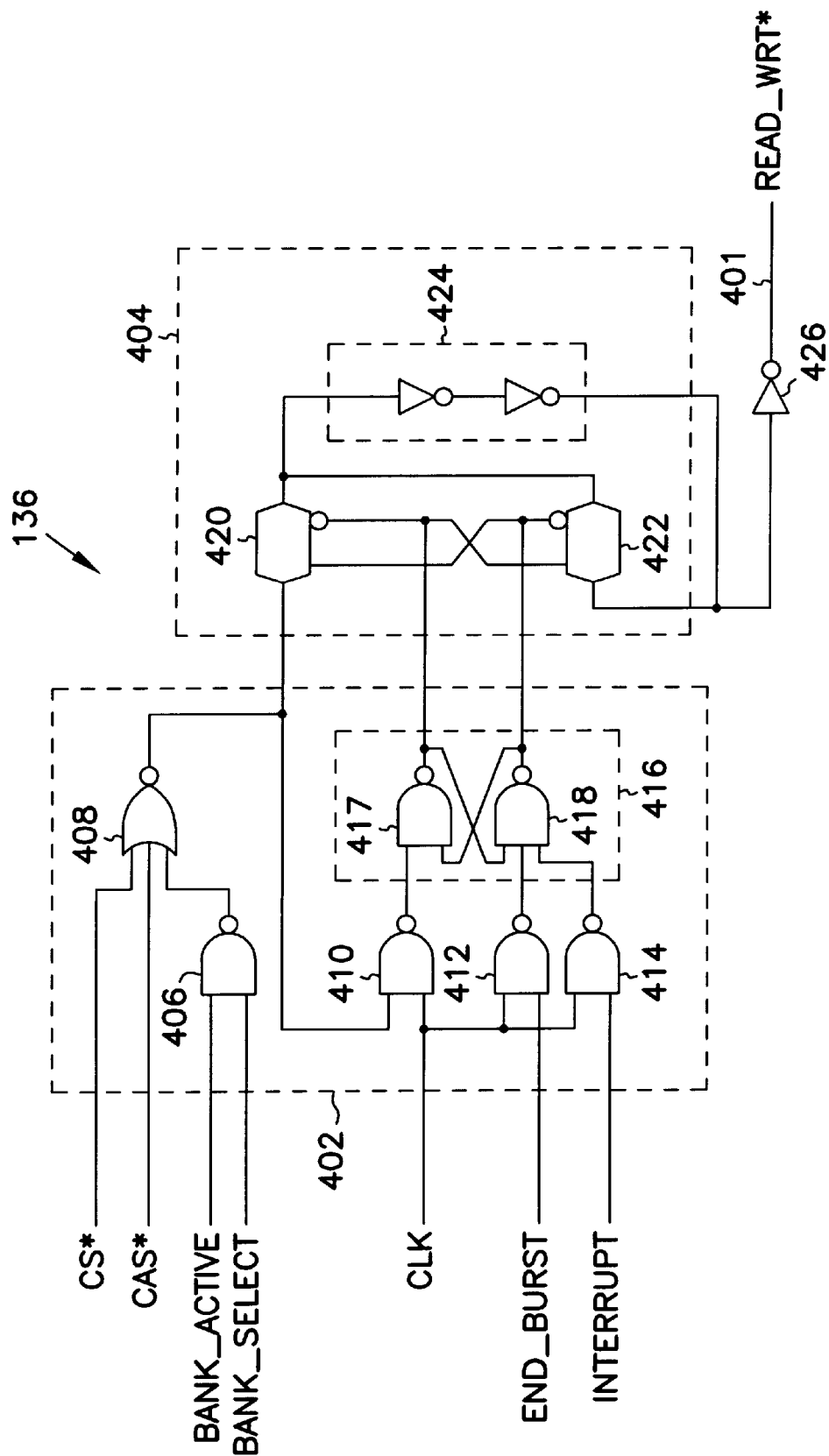
FIG. 4 is a diagram of a setup time read/write circuit of the memory device of FIG. 1.

FIG. 4 is a setup time read/write circuit of memory device 100 for use during the setup times 301 of a read or a write operation. This circuit produces an indication of whether the memory device is to be read or written. The circuit of FIG. 4 also operates in the setup time to determine ahead of the clock transition whether a read or write operation is going to happen. As illustrated in FIG. 4, read/write circuit 136 has an output 401 which produces signal READ_WRT*. When READ_WRT* is at a low state, it indicates that either a read or a write operation is being accessed. For a read/write operation to be performed, a valid combination of input signals is required. A write operation requires BANK_ACTIVE, BANK_SELECT high, and CS*,CAS* and WE* low (WE* is shown in FIGS. 1 and 2). A read operation requires BANK_ACTIVE, BANK_SELECT high, CS*, CAS* low, and WE* high (inactive).

Setup time read/write circuit 136 comprises an input circuit 402 for providing control signals to a read/write output circuit 404, which produces an output signal READ_WRT*. A bank select circuit comprises NAND gate 406 having its output connected to an input of NOR gate 408. NOR gate 408 also receives input signals from CS*, CAS* and produces an output which connects to both input circuit 402 and output circuit 404. Input circuit 402 comprises NAND gates 410, 412 and 414, each of which receives a conventional clock signal CLK. NAND gates 410, 412, 414 also receives input from the output of NOR gate 408, an END_BURST and INTERRUPT signals, respectively. A flip flop 416 is formed by NAND gates 417 and 418 having inputs connected to the outputs of NAND gates 410, 412, 414. The output of flip flop 416 is connected to multiplexers 420 and 422. A latch circuit 424 is connected to an inverter 426 which is coupled output 401 for providing an output signal READ_WRT*. If a combination of the input signals is valid for a read or a write operation, latch circuit 424 passes READ_WRT* to a low state during the setup time. If the combination is not valid then latch 424 will be inactive and READ_WRT* will not be latched.

An advantage of read/write circuit 136 is that, during the setup time, when the status of READ_WRT* is low, memory device 100 can initiate some functions for a read or for a write operation prior to receiving a valid combination of the input signals. Tasks such as presetting counters may be accomplished during this setup time. After the setup time, if the combination of input signals is valid, the read/write operation is few steps ahead and the memory device continues with a read or write operation accordingly.

Figure 5:
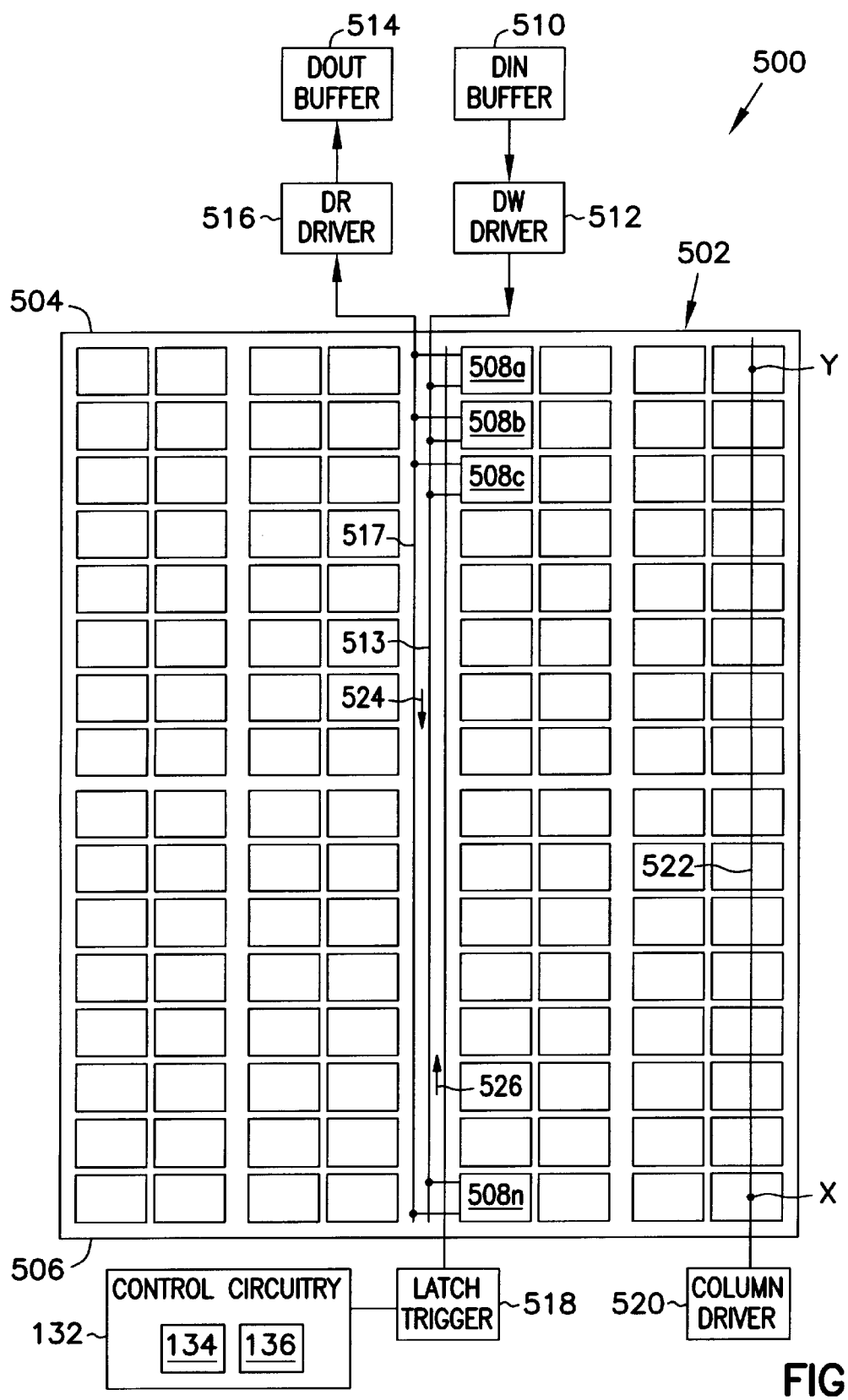
FIG. 5 is a simplified physical layout view of a die of the memory device of FIG. 1.

FIG. 5 is a simplified physical layout view of a die of the memory device of FIG. 1. For the purpose of the invention which uses a setup time to send signal through die; layout 500 is shown with an emphasis on a specific die area 502 which is the location comprising row 124, column 126 decode circuitry and memory cells 120 (shown as block diagram in FIG. 1). Die 502 comprises a "top" 504, a "bottom" 506 and a plurality of memory cell arrays, such as array 508a, 508b, 508c and 508n. The designation of "top" and "bottom" is for descriptive purposes only. In this example, the top 504 area of the die contains the data handling circuitry and the bottom 506 area of the die contains the address and control circuitry. For this example, the present invention minimizes the propagation delay for data and control signals traveling in opposite directions (from top to bottom or bottom to top) by utilizing the setup time to arrange the propagation direction of the data and control signals so that they are propagating in the same direction at the same time.

A data input (DIN) buffer 510 and a data write (DW) driver 512 connected to a DW line 513 are designed for use during a write operation. A data output (DOUT) buffer 514 and a data read (DR) driver 516 connected to a DR line 517 are provided for use during a read operation. In addition, near bottom 506 is a latch trigger 518 designed to produce an enable signal allowing data to be entered into local latches before they are written into the memory cells. A column driver 520 is designed to control column 522 during a memory access. Control circuitry 132 including setup time write circuit 134 and setup time read/write circuit 136 is also located near the bottom.

In a write operation during setup time as described above, data propagates from DIN buffer 510 to DW driver 512 which drives the data along DW line 513. The propagation follows a direction indicated by a direction arrow 524. After the setup time if the write command is valid, following a direction from bottom to top as indicated by direction arrow 526, data from DW line 513 is entered into local latch and written into specific locations of memory arrays 508a–508n. During a read operation, data read from memory arrays 508a–508n propagates from DR line 513 to DR driver 516 and to DOUT buffer 514. The data in a read operation flows in a direction from bottom 506 to top 504. In addition, latch trigger 518 propagates in a direction from bottom 506 to top 504 allowing data to be entered into local latches and into memory cells.

Figure 6:
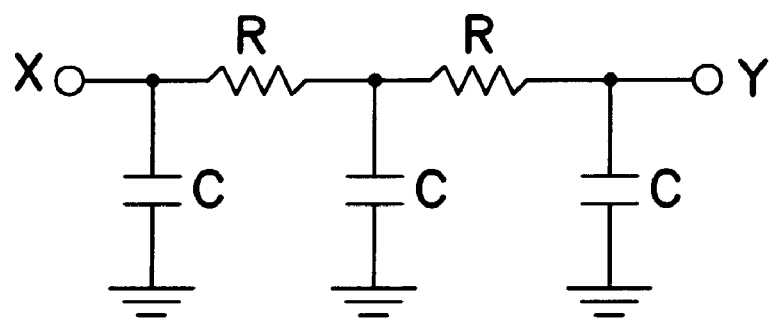
FIG. 6 is an equivalent circuit diagram of a column of FIG. 5.
Figure 7:
FIG. 7 is a timing diagram the circuit of FIG. 6.

Referring to FIG. 5, column 522 (usually made of polysilicon or metal) runs across die area 502. When a signal propagates on the column from point X to point Y, a delay time is introduced. This delay time is commonly known as RC delay time. The RC delay time is illustrated in FIGS. 6 and 7 and is a function of the resistance (R) and capacitance (C) of the line. FIG. 6 shows an equivalent circuit model of column 522. FIG. 7 is a timing diagram of the circuit of FIG. 6. As can be seen from FIG. 7, there is an RC delay time from point X to point Y for a column address signal on column 522. If the memory location to be addressed is near location X, the column address signal arrives earlier than if the memory location to be addressed is near Y. The timing differences are shown in FIG. 7. One advantage of this invention is to minimize the RC delay issue during a memory access operation.

Figure 8:
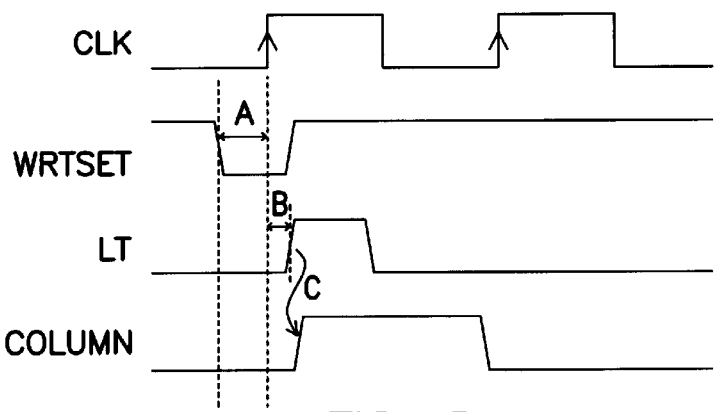
FIG. 8 is timing diagram showing memory device of FIG. 1 during a write operation.

Referring to FIG. 5 and FIG. 8, during the setup time at A, signal WRTSET is anticipating a write operation. At this point, data received from DIN buffer 510 propagates to DW driver 512 which drives the data along DW line 513 from top 504 to bottom 506 in the direction of direction arrow 524. After the setup time, the data has reached the bottom. At time marked B, on the rising edge of CLK, latch trigger 518 fires, indicated by signal LT, and propagates from bottom to top enabling data to be entered into local latches following the direction indicated by direction arrow 526. Following the latch trigger, at time marked C, column is turned on (indicated by signal COLUMN) allowing data from local latches to be written into appropriate memory cells of memory arrays 508a–508n.

Figure 9:
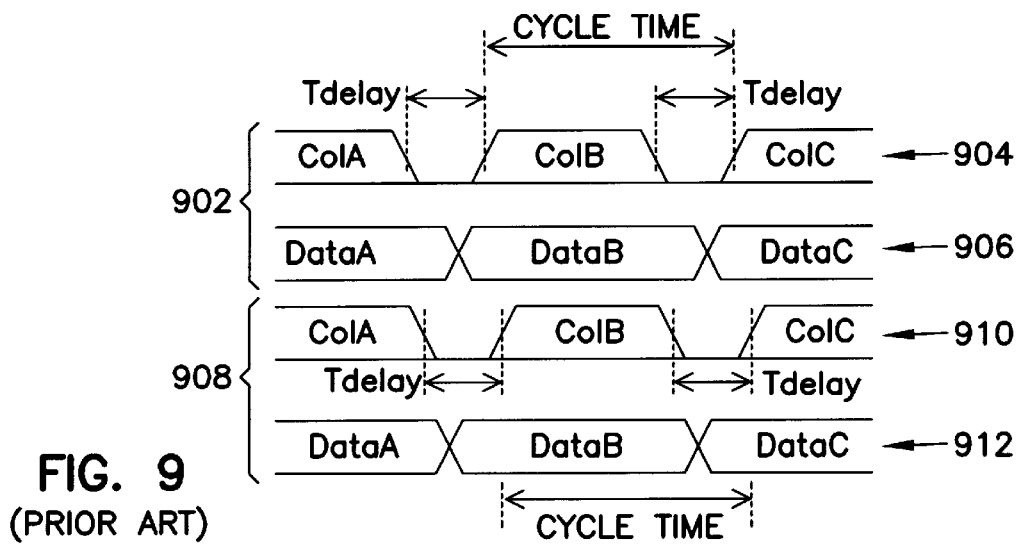
FIG. 9 is a prior art timing diagram showing a memory device during a write operation when both column and data propagate in the opposite direction.
Figure 10:
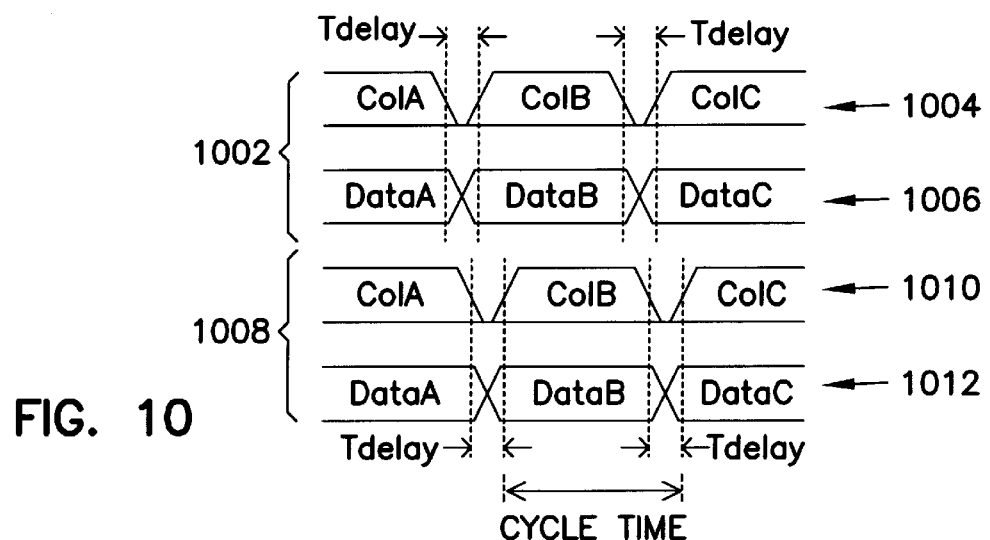
FIG. 10 is a timing diagram showing memory device of FIG. 1 during a write operation when both column and data propagate in the same direction

An advantage of the bottom to top concept in this invention will be come apparent in the descriptions of timing diagrams in FIGS. 9 and 10. FIG. 9 illustrates a prior art timing diagram showing a write operation when data signals and column address signals propagate in the opposite direction. In this case data signals propagate from top 504 to bottom 506 and column address signals propagate from bottom 506 to top 504. Timing portion 902 indicates column address timing 904 and data timing 906 when they are switching near bottom 506. Timing portion 908 indicates column address timing 910 and data timing 912 when they are switching near top 504 after RC delay. In this case, since data and column signals propagate in the opposite direction, and since the data could be written either at the top (short RC delay for the data, long RC delay for the column address) or at the bottom (short RC delay for the column address, long RC delay for the data), a built-in time delay must occur as indicated in FIG. 9 as Tdelay. This time delay is required due to the time in which both columns, such as column A and column B, need to be off when data A and data B are switching. This time delay is necessary for proper operation but is undesirable. The delay time also lenghthens the cycle time, that is, the time between one column is turned on and off until the next column is turned on as indicated in FIG. 9. With the present invention, the time delay can be minimized or avoided by shortening the cycle time since both data and control signals propagate in the same direction.

FIG. 10 illustrates a timing diagram showing a write operation of memory device 100 of FIG. 1 when both data and column address signals propagate in the same direction. Timing portion 1002 indicates column timing 1004 and data timing 1006 when they are switching near bottom 506. Timing portion 1008 indicates column timing 1010 and data timing 1012 when they are switching near top 504 after RC delay. As can be seen, the delay time Tdelay in FIG. 10 is shorter in comparison to the delay time in FIG. 9. Since the delay time is shorter, the cycle time is reduced. This is possible because data and column have the same delay direction since they both start from the same end of the die and hence faster cycle time and faster operation of the memory device is possible.

Conclusion

Although specific embodiments have been illustrated and described herein for purposes of description of the preferred embodiments, it will be appreciated by those of ordinary skill in the art that a wide variety of alternate and/or equivalent implementations calculated to achieve the same purposes may be substituted for the specific embodiments shown and described without departing from the scope of the present invention. As stated above, the description of SDRAM 100 and layout 500 and die area 502 have been simplified for purpose of illustrating the present invention and is not intended to be a complete description of all the feature of a SDRAM. Those with skill in the art will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A memory device, comprising a plurality of inputs for control signals, a first circuit for receiving the control signals to produce an enable signal, wherein the enable signal indicates whether a combination of the control signals is valid for a memory access operation, and a second circuit connected to receive the enable signal, wherein the second circuit generates a setup signal to initiate the memory access operation prior to receiving the enable signal from the first circuit.

2. The memory device of claim 1 wherein the memory access operation is aborted if the enable signal indicates that the combination of the control signals is invalid for the memory access operation.

3. An integrated circuit comprising:

a memory device having a memory area and a control circuit connected to the memory area, the control circuit includes a setup signal responsive to a combination of input signals, during a predetermined setup time, wherein the setup signal initiates a memory operation by accessing the memory area during the predetermined setup time, wherein the setup time occurs prior to the combination of the input signals is validated for the memory.

4. The integrated circuit of claim 3 wherein the control circuit receives a plurality of control signals and an enable signal, and wherein the setup signal initiates the memory operation during the predetermined setup time before the enable signal validates that a combination of the control signals is valid for the memory operation.

5. A system comprising a processor connected to a memory device wherein the memory device comprises a memory area and control circuit connected to the memory area, the control circuit includes a setup time period and a setup signal, wherein the setup signal in response to a combination of input signals, initiates a memory operation by accessing the memory area during the setup time period prior to the combination of the input signals is validated for the memory operation.

6. A substrate, comprising:
   a device having a first and second region;
   a data driver located in the first region; and
   a control circuit located in the second region, wherein the control circuit produces a setup signal during a memory access setup time period to propagate data from the data driver to the second region during the setup time.

7. The substrate of claim 6 further comprises a column driver connected to a memory column, wherein the memory column extends between the first region and the second region.

8. A memory device, comprising:
   a memory area having a number of memory arrays, including a first memory array and a last memory array, wherein the last memory array is physically the most distant array from the first memory array;
   a data write driver located near the first memory array;
   a data write line connected between the data write driver, the first memory array and the last memory array; and
   a control circuit having a setup time period, wherein the control circuit enables data from the data drive driver to propagate to the memory area in the direction from the first memory array to the last memory array during the setup time period.

9. The memory device of claim 8 wherein the first memory array and the last memory array line up in a column.

10. A memory device, comprising:
    a memory portion having a number of memory arrays, including a first memory array and a last memory array, wherein the last memory array is physically the most distant array from the first memory array;
    a data write driver located near the first memory array;
    a data write line connected between the data write driver, the first memory array and the last memory array; and
    control circuit having a setup time period and a setup signal, wherein the setup signal, in anticipating a write operation during the setup time period, initiates the write operation by enabling data from the data write driver to propagate to the memory portion in the direction from the first memory array to the last memory array.

11. The memory device of claim 10 wherein the control circuit further includes a plurality of control signals and an enable signal, and wherein the setup signal initiates the write operation before the enable signal validates that a combination of the control signals is valid for the write operation.

12. A method of accessing a memory device, comprising:
    providing a memory area having a first and second physical location;
    receiving data at the first physical location;
    defining a setup time period; and
    propagating the data from the first physical location to the second physical location during the setup time period.

13. A method of writing to a memory device, comprising:
    receiving data to be written into a memory array;
    defining a setup time period;
    receiving a combination of input signals;
    initiating a write operation during the setup time period and before the combination of input signals is validated for the write operation;
    driving the data to the memory array following a first direction within the memory array; and
    writing the data to the memory array following a second a direction within the memory array.

14. The method of claim 13 wherein driving the data to the memory array occurs during the setup time.

15. The method of claim 13 wherein writing the data to the memory array occurs after the setup time.

16. A method of routing a signal through an integrated circuit having a memory array, comprising:
    receiving a memory access signal;
    receiving a clock signal having a setup time period;
    generating a setup signal in response to the clock signal and the access signal during the setup time period;
    propagating data to the memory array in response to the setup signal during the setup time period; and
    writing the data to the memory array after the setup time period.

17. A method of accelerating a memory access operation, comprising:
    receiving a clock signal having a setup time period;
    receiving control signals; and
    passing the control signals through a setup circuit to initiate a memory access operation during the set up time period, wherein the passing the control signals includes activating a setup signal to start the operation during the setup time period, and wherein the activating of the set up signal occurs before a combination of the control signals is validated for the operation.

18. A method of accelerating a memory access operation comprising:
    receiving a clock signal having a setup time period;
    receiving a combination of control signals;
    activating a setup circuit to initiate a memory access operation in response to the combination of control signals during the setup time period;
    produce an enable signal in response to the combination of control signals during the setup time period;
    sending the enable signal to the setup circuit after the setup time periods wherein the enable signal enables the setup circuit to continue the memory access operation if the combination of control signals is validated for the operation.

19. The method of claim 18 wherein providing the enable signal to the setup circuit after the setup time period includes allowing the memory access operation to continue if the combination of the control signal is valid for the memory access operation.

20. The method of claim 18 wherein providing the enable signal to the setup circuit after the setup time period includes terminating the memory access operation if the combination of the control signal is invalid for the memory access operation.

* * * * *

UNITED STATES PATENT AND TRADEMARK OFFICE
CERTIFICATE OF CORRECTION

PATENT NO.    : 6,205,085 B1
DATED         : March 20, 2001
INVENTOR(S)   : Morgan et al.

It is certified that error appears in the above-identified patent and that said Letters Patent is hereby corrected as shown below:

Column 8, claim 3,
Line 61, delete "memory" and insert -- memory operation --, therefor.

Column 9, claim 5,
Line 5, delete "the setup signal" and insert -- the setup signal, --, therefor.

Column 10, claim 18,
Line 50, delete "periods" and insert -- period, --, therefor.

Signed and Sealed this

Twentieth Day of November, 2001

Attest:

*Attesting Officer*

NICHOLAS P. GODICI
*Acting Director of the United States Patent and Trademark Office*